United States Patent [19]
Resler et al.

[11] Patent Number: 5,691,907
[45] Date of Patent: Nov. 25, 1997

[54] DEVICE FOR PROGRAMMING MULTIPLE ARRAYS OF SEMICONDUCTOR DEVICES

[75] Inventors: Edwin W. Resler, San Jose; Vincent L. Tong, Fremont; Russell C. Swanson; W. Scott Bogden, both of San Martin, all of Calif.

[73] Assignee: Xilinx Inc., San Jose, Calif.

[21] Appl. No.: 425,017

[22] Filed: Apr. 18, 1995

Related U.S. Application Data

[62] Division of Ser. No. 74,190, Jun. 10, 1993, Pat. No. 5,466,117.

[51] Int. Cl.$^6$ ..................................................... G06F 19/00
[52] U.S. Cl. ..................... 364/468.28; 364/478.01; 414/935
[58] Field of Search ..................... 364/478, 488–491, 364/468.28, 478.01, 468.21; 326/38–41; 414/935–941, 799; 437/7, 8

[56] References Cited

U.S. PATENT DOCUMENTS

| | | | |
|---|---|---|---|
| 4,156,926 | 5/1979 | Hartman | 395/484 |
| 4,441,853 | 4/1984 | Kosugi | 414/757 |
| 4,477,884 | 10/1984 | Iwahashi et al. | 365/189 |
| 4,556,362 | 12/1985 | Bahnck et al. | 414/744 |
| 4,655,584 | 4/1987 | Tanaka et al. | 355/53 |
| 4,675,673 | 6/1987 | Oliver | 364/488 X |
| 4,892,455 | 1/1990 | Hine | 414/417 |
| 4,907,701 | 3/1990 | Kobayashi et al. | 209/576 |
| 5,149,667 | 9/1992 | Choi | 437/52 |
| 5,150,797 | 9/1992 | Shibata | 209/573 |
| 5,174,067 | 12/1992 | Hasegawa et al. | 51/133 |
| 5,290,134 | 3/1994 | Baba | 414/404 |
| 5,293,179 | 3/1994 | Ichidawa et al. | 346/140 |
| 5,340,261 | 8/1994 | Oosawa et al. | 414/217 |
| 5,359,571 | 10/1994 | Yu | 365/230.03 |

*Primary Examiner*—Joseph Ruggiero
*Attorney, Agent, or Firm*—Jeanette S. Harms

[57] ABSTRACT

A method in accordance with the present invention includes programming a plurality of semiconductor devices simultaneously, thereby dramatically increasing the number of devices programmed within a predetermined time. In one embodiment, this method includes arranging a first plurality of semiconductor devices into an array configuration. The first array is then programmed while a second plurality of semiconductor devices is arranged into the array configuration. The second array is then programmed, while the first array is unloaded and a third plurality of semiconductor devices is arranged into the array configuration. The present invention further includes the step of moving the first plurality of semiconductor devices in the array configuration to a programming position and the step of transferring the first plurality of semiconductor devices to an unloading position. The steps of moving or transferring includes providing a vacuum, mechanical pick-up, or magnetic pick-up for moving the semiconductor devices. In one embodiment, the step of loading is performed by a first arm capable of three dimensional movement, and the step of unloading is performed by a second arm capable of three dimensional movement independent of the first arm. In this embodiment, the step of moving or transferring is performed with a dual head array mechanism capable of moving independently from the first and second arms.

5 Claims, 9 Drawing Sheets

DEVICE FOR PROGRAMMING MULTIPLE ARRAYS OF SEMICONDUCTOR DEVICES

This application is a division of application Ser. No. 08/074,190 filed Jun. 10, 1993 now U.S. Pat. No. 5,466,117.

BACKGROUND OF THE INVENTION

1. Field of the Invention

The present invention relates to programming of semiconductor devices, and in particular to the reduction of the time to program these semiconductor devices.

2. Description of the Related Art

The programming of semiconductor devices is well known in the art. Typically, this programming includes a verification step that ensures the semiconductor devices are properly programmed and meet customer programming specifications. To perform the programming, the semiconductor devices are coupled to the programming electronics through sockets. In high volume manufacturing applications, the semiconductor devices are inserted into these sockets with a piece of equipment, typically referred to as an autohandler or a pick and place machine, having an automatic arm.

In a typical program cycle, the automatic arm loads an individual semiconductor device from an input tray into a socket to be programmed. After programming, the automatic arm unloads that device to an output tray. Then, the next semiconductor device is loaded, programmed, and unloaded. Thus, particularly if the semiconductor device programming time is long, this method is extremely time consuming and results in significant periods of time in which the automatic arm remains inactive, thereby resulting in production inefficiencies.

Therefore, a need arises for a device and method which maximize the efficiency of programming a plurality of semiconductor devices.

SUMMARY OF THE INVENTION

A method in accordance with the present invention includes programming a plurality of semiconductor devices simultaneously, thereby dramatically increasing the number of devices programmed within a predetermined time. In accordance with one embodiment, a method for programming a plurality of semiconductor devices includes arranging a first plurality of semiconductor devices into an array configuration. The first array is then programmed while a second plurality of semiconductor devices is arranged into the same array configuration. The second array is then programmed, while the first array is unloaded and a third plurality of semiconductor devices is arranged into the array configuration. In one embodiment of the present invention, the step of arranging includes individually placing each semiconductor device of the plurality of semiconductor devices into the array configuration, and the step of unloading includes transferring the plurality of semiconductor devices individually from the array configuration. In another embodiment of the present invention, the step of arranging includes placing multiple semiconductor devices into the array simultaneously, and the step of unloading includes transferring multiple semiconductor devices from the array simultaneously.

A method in accordance with the present invention further includes the step of moving the first plurality of semiconductor devices in the array configuration to a programming position, and the step of transferring the first plurality of semiconductor devices to an unloading position after the step of programming the first plurality of semiconductor devices and before the step of programming the second plurality of semiconductor devices. The steps of moving or transferring include providing a vacuum, mechanical pick-up, or magnetic pick-up for moving the semiconductor devices.

In further accordance with the present invention, a device for accomplishing the above steps includes means for loading semiconductor devices into an array, a mechanism for moving one or multiple arrays of semiconductor devices, and means for unloading semiconductor devices from the array. In one embodiment, the means for loading the semiconductor devices includes a first arm capable of three dimensional movement and the means for unloading the semiconductor devices includes a second arm capable of three dimensional movement independent of said first arm. The mechanism includes an array mover having a first head for moving one array and a second head for moving another array. The array mover is capable of moving independently from the first and second arms.

Because the arms and the array mover are capable of moving independently from one another, the present invention provides significant production improvements for any programming cycle irrespective of the device being programmed and the semiconductor device size. Moreover, if the circuits on the semiconductor device program within a short period of time, the present invention dramatically reduces the time required in prior art methods to program a plurality of semiconductor devices. Thus, the present invention minimizes inactive time of the components in the system, thereby allowing more semiconductor devices to be programmed within a predetermined time period.

In another embodiment of the present invention, a method for programming a plurality of semiconductor devices includes the steps of loading a first plurality of semiconductor devices individually into a programming platform with a first arm, programming each of the first plurality of semiconductor devices immediately upon loading of that device, and unloading each of the first plurality of semiconductor devices with a second arm from the programming platform immediately upon completion of programming. In this method, the steps of loading and unloading are synchronized, thereby maximizing the efficiency of movement of the first and second arms.

A device for accomplishing the synchronized method described above includes a first arm having three dimensional movement for loading semiconductor devices into an array configuration, and a second arm having three dimensional movement for unloading the semiconductor devices from the array configuration.

In further accordance with the present invention, each semiconductor device is capable of being programmed individually. Specifically, the present invention includes a path associated with each semiconductor device to provide commands to and from an individual programming software module. In this manner, each semiconductor device may differ in type and in size from any other semiconductor device. In one embodiment of the invention, a production program controls the plurality of programming software modules and provides information to the user regarding the progress of the programming. A typical path includes a means for providing an electrical connection, such as an interchangeable socket, to the semiconductor device and programmer electronics.

In yet another embodiment of the present invention, a rotating platform provides an efficient method for programming dice on multiple wafers simultaneously. This method includes the steps of loading a first plurality of wafers onto a platform, rotating the platform, programming the first plurality of wafers while loading a second plurality of wafers onto the platform, rotating the platform a second time, and programming the second plurality of wafers while unloading the first plurality of wafers. To provide proper wafer alignment during programming, the present invention provides a structure having a system for selectively moving a wafer along three axes. In one embodiment, this means for selectively moving includes a plurality of eccentric cams for moving the wafer along two axes, i.e. an x and a y axis, and at least one roller for rotating the wafer on a third axis, i.e. a z axis.

DETAILED DESCRIPTION OF THE DRAWINGS

Figure 4:
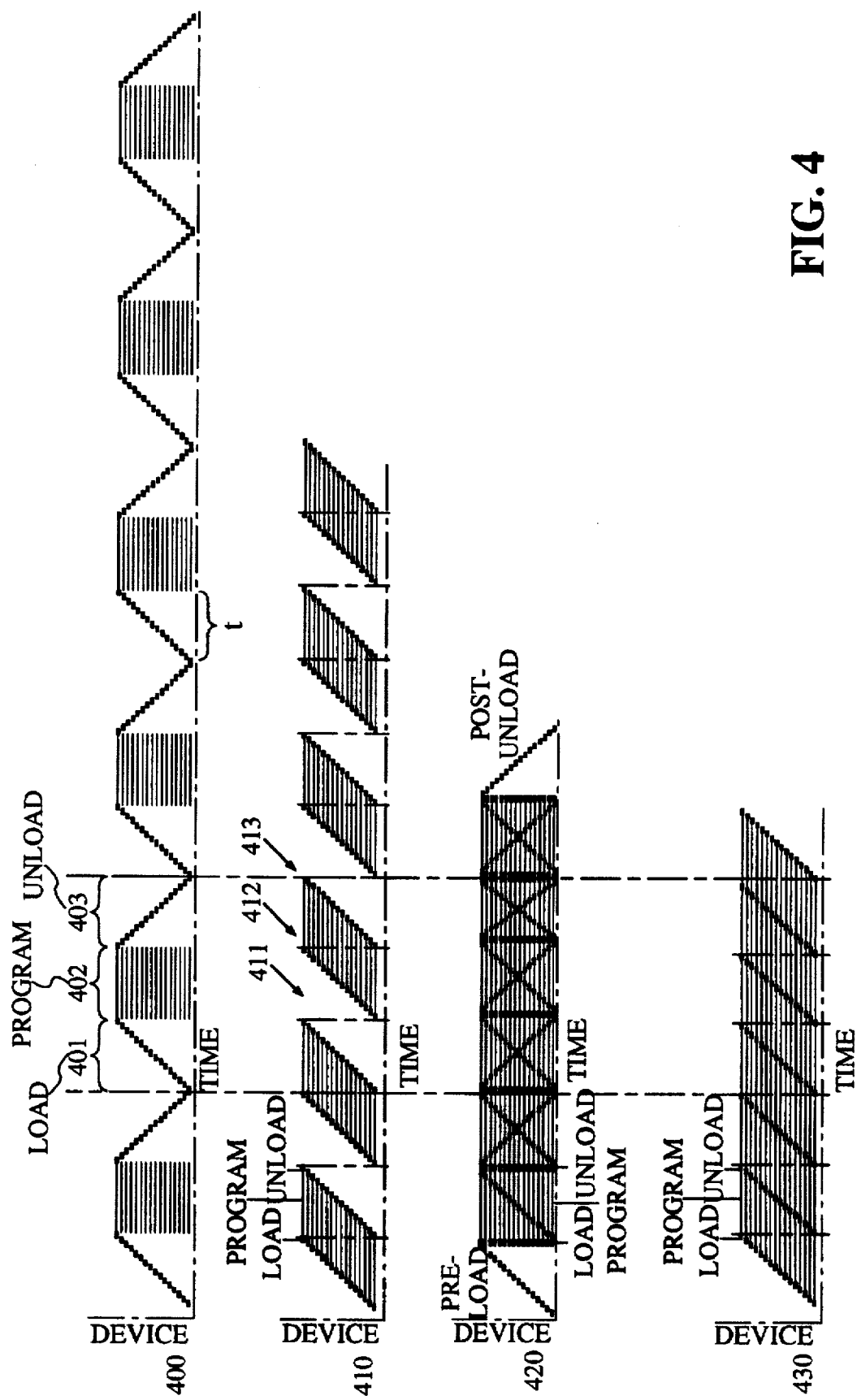
FIG. 4 compares the timing diagrams of various methods of programming a plurality of semiconductor devices.

A method in accordance with the present invention includes programming a plurality of semiconductor devices simultaneously, thereby dramatically increasing the number of devices programmed within a predetermined time. Referring to FIG. 4, a programming cycle 400 includes a loading period 401 in which an automatic arm having three-dimensional movement transfers a plurality of semiconductor devices individually from a bin onto a programming platform. During a programming period 402, all semiconductor devices are simultaneously programmed and verified. Finally, during an unloading period 403, the automatic arm transfers the semiconductor devices individually to a shipping tray (if the semiconductor device meets predetermined programming requirements) or a reject tray (if the semiconductor device fails predetermined programming levels). Thus, the increase in efficiency of programming semiconductor devices is approximately proportional to the number of devices being simultaneously programmed. Therefore, in one embodiment, the present invention provides an increase in efficiency of about 16× if compared to the prior art.

Another method increases efficiency by allowing the automatic arm to load or unload other devices during the programming process. Specifically, and referring to programming cycle 410 of FIG. 4, after the automatic arm transfers a semiconductor device to the testing platform, programming of that semiconductor device begins. In accordance with this method, the automatic arm completes the loading of a plurality of semiconductor devices before beginning the unloading of these devices. Assuming the loading of the plurality of semiconductor devices is complete, the automatic arm immediately transfers each semiconductor device to the appropriate tray after it is programmed. Thus, the loading period 411 overlaps with programming period 412, and the programming period 412 overlaps with the unloading period 413. After all semiconductor devices are unloaded, the cycle repeats. However, this method still results in production inefficiencies, (the system being less than optimally utilized) particularly if the components on the semiconductor device require a short time period, i.e. approximately 25 seconds, to program.

In other embodiments of the present invention, dual automatic arms allow load and unload operations to occur simultaneously, thereby further improving production efficiency. One embodiment of the present invention will be described in reference to FIGS. 1, 2, and 3. Step 200 (FIG. 2) shows an array mover 107 in the autohandler of the present invention at a pre-operation stage. During this pre-operation stage, a plurality of semiconductor device trays T100A–T100J (each tray T100 holding a plurality of packaged semiconductor devices) as well as a plurality of empty trays T108A–T108J are placed in their respective loading positions. During step 201, the first tray T100A is placed into an input position 101 using conventional automatic methods.- Step 201 takes a time period 301 (FIG. 3) which varies depending on the semiconductor devices being moved, i.e, on both the size and type of the device. In this embodiment of the present invention, time period 301 is approximately 1.6 seconds. Then, in step 202, arm 106A (FIG. 1), which is a conventional automatic arm having three dimensional movement, transfers semiconductor devices individually from tray T100A to an array configuration (hereinafter array) 100A at a pre-program position 102. Note for drawing simplicity, arms 106A and 106B are illustrated only in FIG. 1, whereas array mover 107 is illustrated only in FIG. 2. However, positions 101, 102, 103, 104, and 105 are illustrated in both FIGS. 1 and 2.

Figure 3:
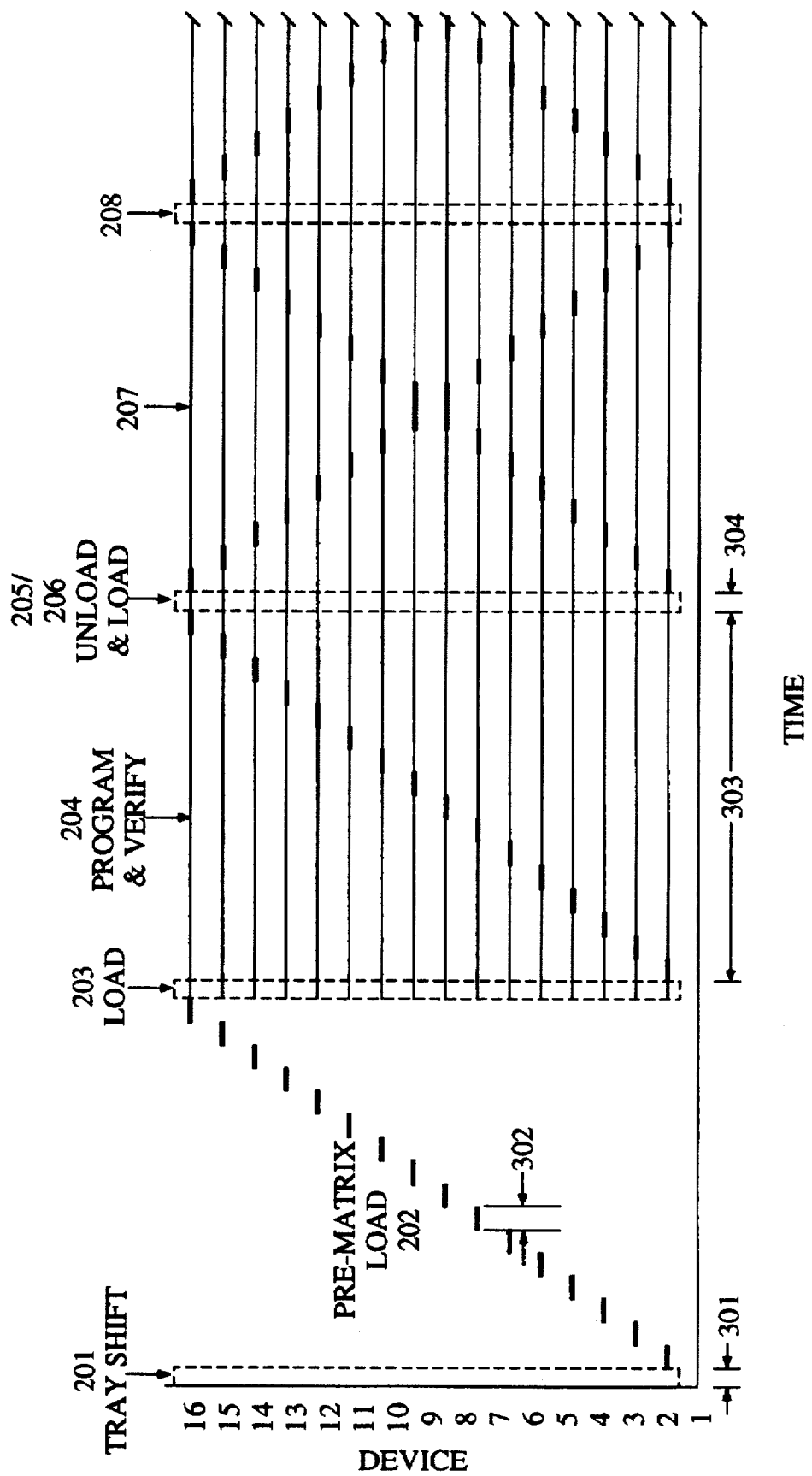
FIG. 3 illustrates a basic schematic of a timing diagram in accordance with one embodiment of the present invention.

Referring to FIG. 3, each semiconductor device transfer takes a time period 302 which is also 1.6 seconds in this embodiment. For maximum efficiency, the maximum allowable device transfer time is calculated using equation 1 below:

$$\text{Maximum device transfer time} = \frac{\text{Minimum program time}}{\text{\#devices being programmed}} \quad (\text{Eq. 1})$$

Note that the pre-program position 102, the program position 103, and the post-program position 104 have the identical array configuration, which facilitates the use of array mover 107 (explained in detail below). For example, in one embodiment, pre-program position 102, program position 103, and post-program position 104 have an orthogonal array configuration (see FIG. 1). In another embodiment, all positions have a circular array configuration. Array mover 107 includes two linked heads 107A and 107B, each head being capable of two dimensional movement. Heads 107A and 107B typically move independently from one another in one dimension (i.e. vertical), but move identically in the other dimension (i.e. horizontal).

In step 203, head 107A picks up array 100A and moves array 100A to program position 103. In one embodiment, the pick up and moving of the array is accomplished by using a conventional vacuum method. In other embodiments of the present invention, other methods are used, including but not limited to, mechanical and magnetic pick-up/transfer. Additionally, during step 203, the next tray, i.e. tray T100B, is moved into input position 101. Preferably, step 203 takes the same time period as time period 301 (FIG. 3). During step 204, the semiconductor devices of array 100A are programmed and verified. In this embodiment of the present invention, head 107A holds the individual semiconductor devices of array 100A in their respective sockets to minimize damage to lead coplanarity of packaged semiconductor devices. Additionally, during step 204, arm 106A transfers the semiconductor devices of tray T100B to pre-program position 102. Step 204 takes time period 303 which, in this embodiment, is approximately 25 seconds minimum.

In step 205, array mover 107 shifts its position such that head 107A picks up array 100B and head 107B picks up array 100A. Then, in step 206, head 107A transfers array 100B from pre-program position 102 to the program position 103, and head 107B transfers array 100A from program position 103 to the post-program position 104. During this transfer, another tray T100C is simultaneously loaded into input position 101. As shown in FIG. 3, steps 205 and 206 take a time period the same as that required for step 203, for example.

In step 207, array 100B is programmed. Simultaneously, arm 106A (FIG. 1) individually transfers the semiconductor devices of tray T100C from the input position 101 to the pre-program position 102. At the time of this programming and transferring, head 107B (FIG. 2) is lifted to allow arm 106B (FIG. 1) to individually transfer the semiconductor devices of array 100A from post-program position 104 to an empty tray T108A. Note that in one embodiment of the present invention, if a semiconductor device of any array is bad, then that bad semiconductor device is deposited in reject tray 109 during step 207.

Finally, in step 208, shipping tray T108A is transferred from the output position. At the same time, array mover 107 is moved such that head 107A picks up array 100C and head 107B picks up array 100B. Then, steps 206–208 are repeated until the last shipping tray, i.e. tray T108J, is transferred from the output position.

Assuming a programming time per semiconductor device of approximately 25 seconds, the present invention (programming cycle 420 shown in FIG. 4) provides a significant time reduction of 30% compared to the method having overlapping program and load/unload time periods (programming cycle 410) and provides a dramatic time reduction of 50% compared to the method having separate program, load, and unload time periods (programming cycle 400). However, other components take much longer periods of time to program. Furthermore, the larger the semiconductor device, the longer the time period required to program the semiconductor device. For example, a small semiconductor antifuse device having 1k gates typically takes 1.3 minutes, but a large semiconductor antifuse device having 20k gates takes approximately 32 minutes. The present invention, which maximizes efficiency of the arms and array mover during all phases of the programming operation, improves programming cycles for any array of semiconductor devices, irrespective of the component being programmed and the size of the semiconductor device.

Another embodiment of the present invention shown in programming cycle 430 of FIG. 4 eliminates the need for the array mover. Specifically, a first arm individually loads a first semiconductor device from an input tray into the programming position. Note that in this embodiment, a mechanism secures the semiconductor device to the socket. In this manner, the first semiconductor device begins to be programmed upon its placement in the programming position. During programming of the first semiconductor device, the first arm is loading other semiconductor devices into their respective programming positions. Once programming is complete for the first semiconductor device, for example, a second arm individually unloads the first semiconductor device into an output tray. Simultaneously, the first arm is loading a second semiconductor device from the input tray into the same programming position. Thus, the movements of the dual arms are synchronized, thereby further reducing the time required for the programming cycle.

Figure 5A:
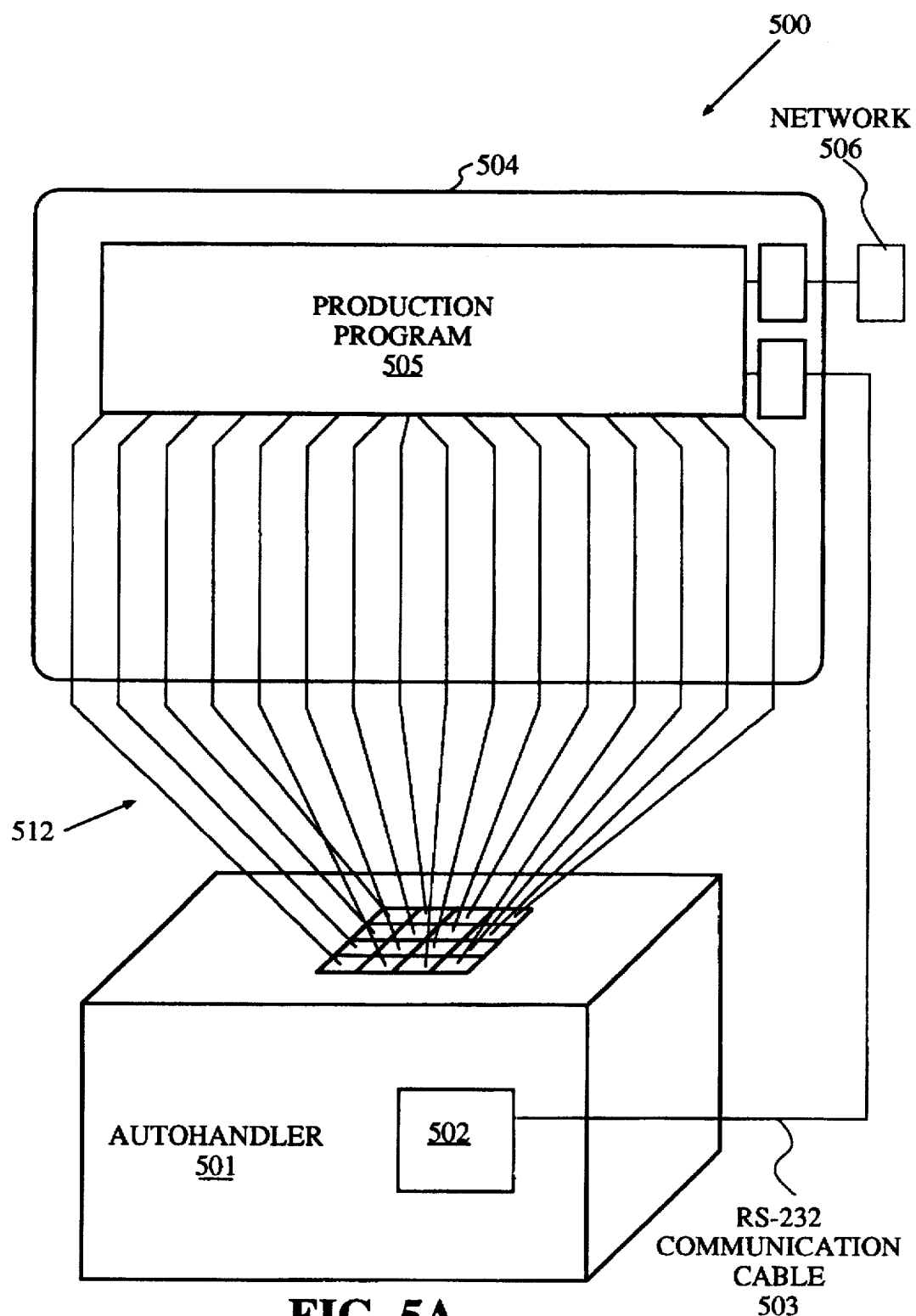
FIG. 5A shows a schematic of a system in accordance with the present invention.

FIG. 5A illustrates a schematic of a system 500 in accordance with the present invention. System 500 includes an autohandler 501 having multiple arms for loading and unloading semiconductor devices and, in one embodiment, an array mover. Note that any conventional arms capable of three dimensional movement and any conventional array mover capable of two dimensional movement may be used in the present invention. For example, one arm capable of three dimensional movement is available through Klinger, having a place of business at 979 Stewart Avenue, Garden City, NY., under the part number GV88XYZ.

Figure 1:
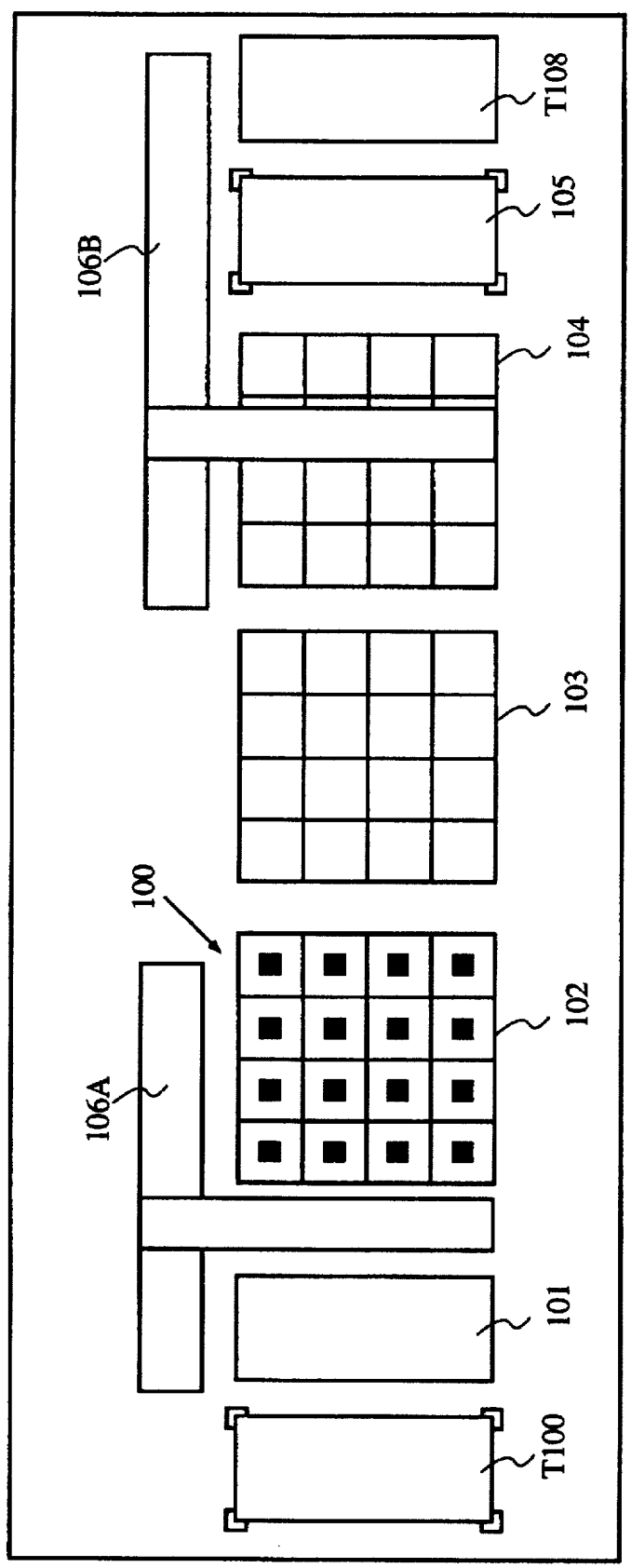
FIG. 1 illustrates a planar view of an autohandler having two arms in accordance with the present invention.
Figure 2:
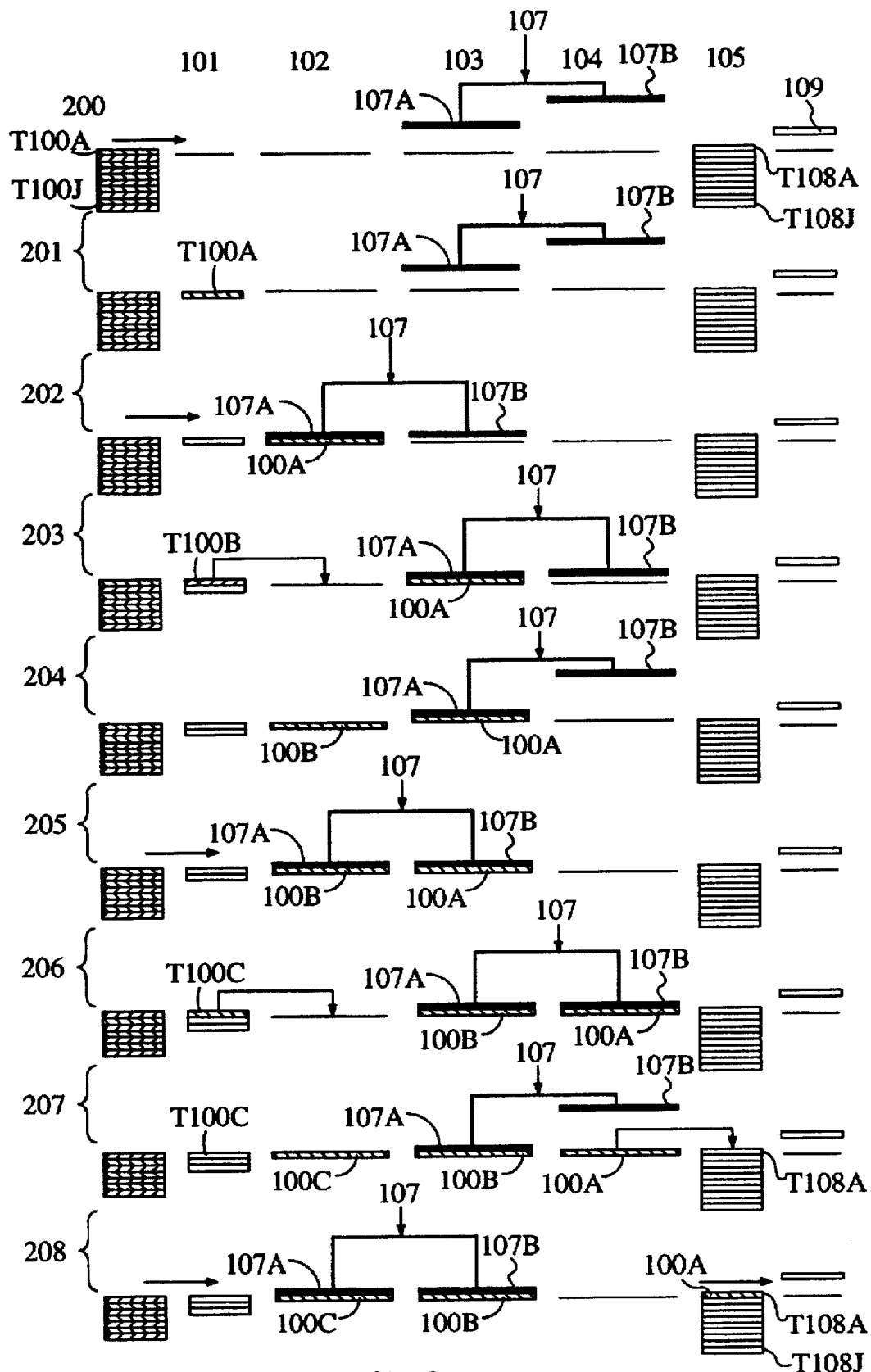
FIG. 2 shows an array mover of the autohandler in accordance with the present invention at predetermined times during a program cycle.

A computer 502 controls autohandler 501. Specifically, signals are sent between a computer workstation 504 and computer 502 via line 503, which is typically an RS-232 communication cable. These signals include, for example, Program Start signals (from computer 502) sent after all semiconductor devices are positioned in their respective sockets, or Program Stop signals (from workstation 504) sent after all semiconductor devices are programmed and are ready to be transferred to post-program position 104 (FIG. 1).

Workstation 504, in one embodiment, is a SUN® workstation using a UNIX® multi-tasking operating system. Thus, the production program 505, connected to the network 506, is able to simultaneously control selective programming of each semiconductor device on the array via individual programming algorithms and electronics (explained in detail in reference to FIG. 5B). In addition to implementing the customer's design on a semiconductor device, production program 505 also provides status information to the personnel overseeing the programming process.

Figure 5B:
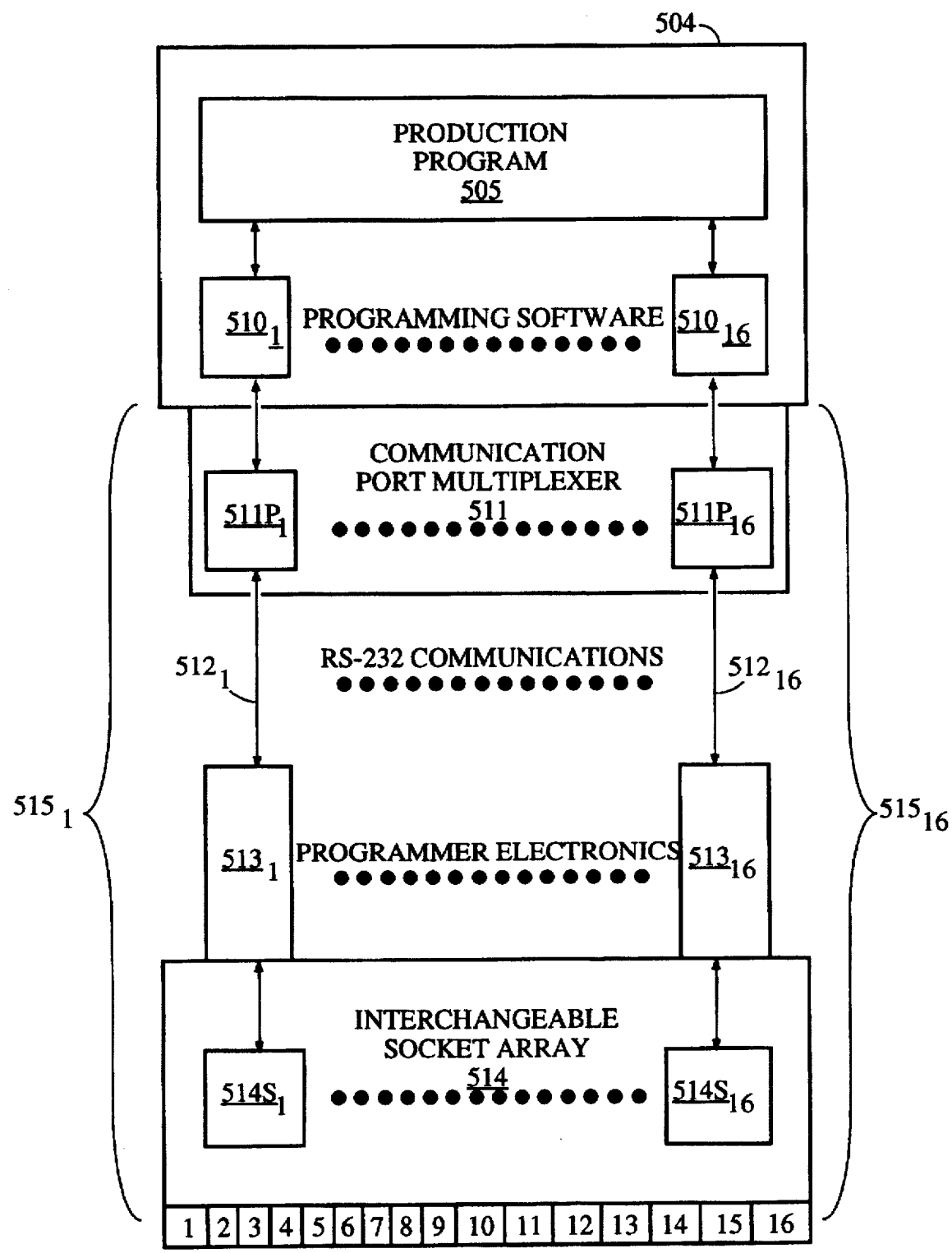
FIG. 5B illustrates a system which provides the capability of simultaneously running individual programs for all the semiconductor devices in the array.

FIG. 5B illustrates a portion of system 500 which provides the capability of simultaneously running individual programs for all the semiconductor devices in the array. Specifically, workstation 504 includes programming software modules $510_1$–$510_{16}$ which are controlled by production program 505. These modules provide the commands to program each semiconductor device 1–16, respectively. Commands from a specific module, for example module $510_1$, are provided to semiconductor device 1 via path $515_1$. Each path 515 includes one port 511P of the serial port multiplexer 511, an RS-232 communication cable 512, programmer electronics 513, and means for providing an electrical connection to the semiconductor device, for example an interchangeable socket 514S in array 514. As shown in FIG. 5B, signals travel in both directions along path 515. For example, after programming of the semiconductor is complete, production program 515 is triggered by programmer electronics 513 to initiate verification of this programming. Note that multiplexer 511, RS-232 communication cables 512, programmer electronics 513, and socket array 514 are conventional components well known to those skilled in the art, and are therefore not explained in detail herein.

Thus, because the present invention includes a path associated with each semiconductor device to provide commands to and from an individual programming software module, each semiconductor device is capable of being programmed individually. The programming software modules 510 vary depending on the type of semiconductor device being programmed and the type of programming. For example, in one embodiment of the present invention, programming includes providing commands to achieve adaptive routing in an antifuse array. This interactive routing is explained in detail in U.S. Pat. No. 5,349,248, issued Sep. 20, 1994 entitled "Adaptive Programming Method for Antifuse Technology, which is incorporated by reference in its entirety. In another embodiment, an individual semiconductor device differs in type and in size from at least one other semiconductor device.

Figure 6:
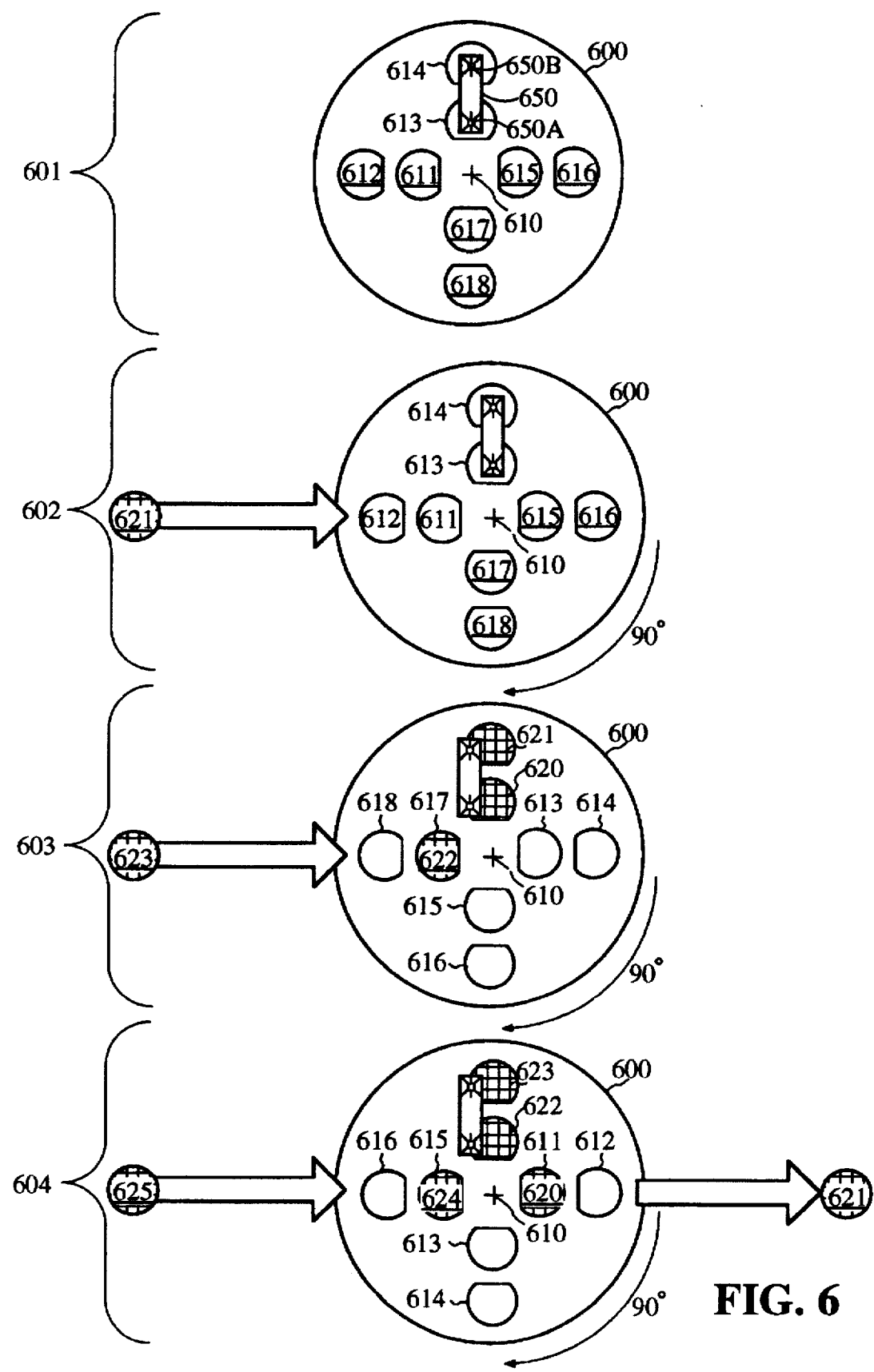
FIG. 6 illustrates one programming cycle of an embodiment of the present invention having a rotating programming platform.

In another embodiment of the present invention illustrated in FIG. 6, the semiconductor devices being programmed are wafers and the programming platform 600 rotates. Programming platform 600 provides wafer wells 611–618 which aid in positioning the wafers for programming by probes 650A and 650B. In this embodiment, the wafers have identical dice maps. Therefore, probes 650A and 650B, which are coupled together by an arm 650 having three dimensional movement, provide maximum programming efficiency by moving in identical programming patterns. For example, if probe 650A is programming a die at a third location (not labeled) on a first wafer, then probe 650B is programming a die at a third location on a second wafer. Step 601 shows programming platform 600 before programming of the dice on the wafers begins.

In step 602, wafer 620 is moved using conventional methods to wafer well 611, and wafer 621 is moved to wafer well 612. After wafer wells 611 and 612 are loaded, programming platform 600 is rotated (for example, clockwise) around pivot 610 by 90 degrees. In this manner, wafers 620 and 621 are positioned for programming by probes 650A and 650B, respectively, as shown in step 603. During step 603, the dice on wafers 620 and 621 are programmed. Simultaneously, wafers 622 and 623 are loaded into wafer wells 617 and 618, respectively. Then, programming platform 600 is rotated (once again clockwise) by 90 degrees. Thus, wafers 622 and 623 are positioned for programming by probes 650A and 650B, respectively, as shown in step 604. During step 604, the dice of wafers 622 and 623 are programmed. Simultaneous to this programming, wafers 624 and 625 are loaded into wafer wells 615 and 616, respectively, and wafers 620 and 621 are unloaded from wafer wells 611 and 612, respectively. Note that conventional methods are used to unload wafers 620 and 621.

Figure 7:
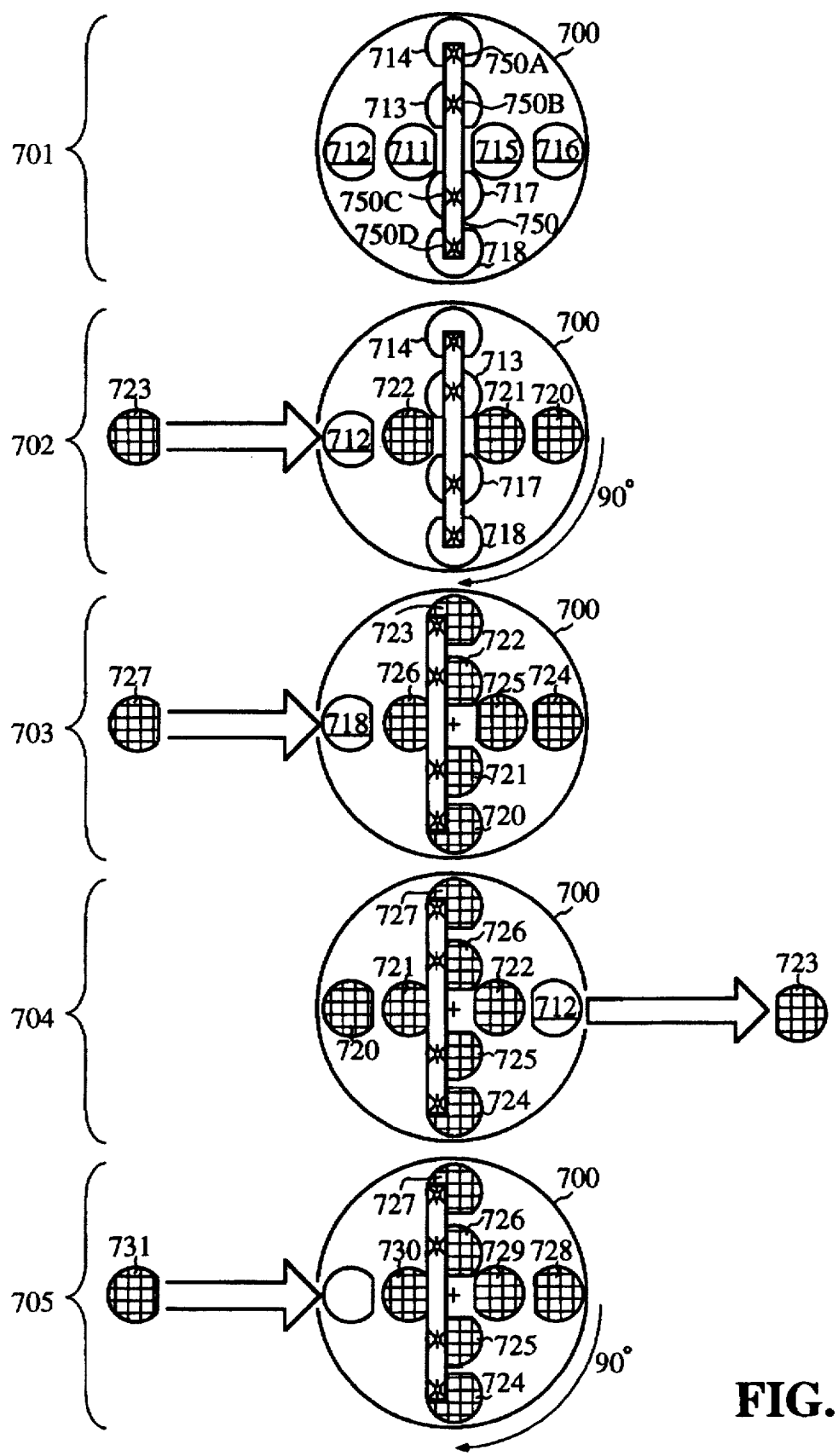
FIG. 7 shows one programming cycle of another embodiment of the present invention having a rotating programming platform.

Another embodiment of the present invention having a rotating programming platform is illustrated in FIG. 7. This embodiment provides four probes 750A-750D on arm 750. Thus, following pre-operation stage 701, four wafers 720–723 are loaded into wafer wells 716, 715, 711, and 712, respectively. Then, programming platform 700 is rotated by 90 degrees. As wafers 720–723 are programmed in step 703, wafers 724–727 are loaded into wafer wells 714, 713, 717, and 718, respectively. Once again, programming platform 700 is rotated by 90 degrees. As wafers 724–727 are programmed, wafers 720–723 are unloaded in step 704. Finally, in step 705, while wafers 724–727 are still being programmed, wafers 728–731 are loaded. Thus, if compared to the programming platform described in reference to FIG. 6, this embodiment effectively doubles the number of wafers programmed within a predetermined period.

Figure 8:
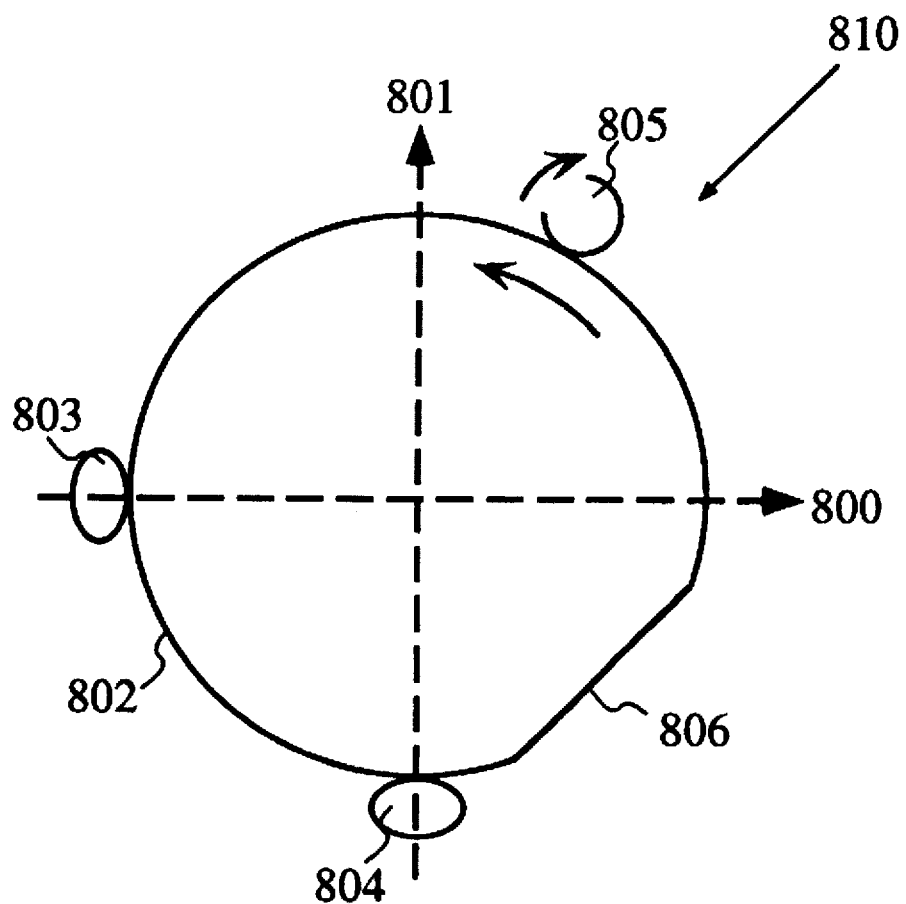
FIG. 8 illustrates a structure for aligning the wafers for programming in accordance with the present invention.

FIG. 8 illustrates a system 810 to provide proper wafer alignment on a programming platform (not shown) during programming. This system 810 selectively moves a wafer 802 along two axes, i.e. x-axis 800 and y-axis 801, and selectively rotates wafer 802 on a third axis, i.e. z-axis 807 (coming out of the page). In one embodiment, system 810 includes a plurality of eccentric cams, i.e. cams 803 and 804, for moving wafer 802 along axes 800 and 801, and at least one driver roller 805 which rotates wafer 802. Typically, driver roller 805 is spring loaded, thereby providing a flexibility to the movement of wafer 802 if cam 803 or cam 804 is operated. Structure 810 includes means for determining the proper wafer alignment. In one embodiment, this means for determining includes an optical sensing system (not shown). In other embodiments, this means for determining includes a mechanical sensing means associated with the flat portion 806 of wafer 802. After alignment, wafer 802 is held on the programming platform (not shown) via conventional methods.

The above description is meant to be illustrative only and not limiting. For example, the description of the present invention refers to semiconductor devices which include both packaged and bare dice. Additionally, although the described embodiments of the present invention refer to trays T100, other device holders, such as tubes are used in other embodiments. Moreover, a socket change kit allows the present invention to handle different semiconductor device types, such as different size packages or dice. Those skilled in the art will recognize other embodiments of the present invention based on the specification. The present invention is set forth in the appended claims.

We claim:

1. A system of programming a plurality of semiconductor devices comprising:

means for providing electrical connections to said plurality of semiconductor devices during programming;

a plurality of programmer electronics, each programmer electronics coupled to said means for providing electrical connections;

a plurality of modules for providing command signals to program said plurality of semiconductor devices, each module providing command signals to one programmer electronics; and means for transferring said command signals to said plurality of programmer electronics.

2. The system of claim 1 wherein said means for providing electrical connections includes interchangeable sockets.

3. The system of claim 1 wherein said means for transferring includes a plurality of communication lines, each communication line coupled to one programmer electronics.

4. The system of claim 3 wherein said means for transferring further includes a plurality of communication ports, each communication port coupled between one module and one communication line.

5. The system of claim 1 further comprising a production program for controlling said plurality of modules.

* * * * *